US006854094B2

(12) United States Patent
Inui et al.

(10) Patent No.: US 6,854,094 B2
(45) Date of Patent: Feb. 8, 2005

(54) METHOD AND APPARATUS FOR LAYING OUT POWER SUPPLY WIRING

(75) Inventors: Masuo Inui, Kasugai (JP); Takashi Kurihara, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 104 days.

(21) Appl. No.: 10/261,491

(22) Filed: Oct. 2, 2002

(65) Prior Publication Data

US 2003/0110461 A1 Jun. 12, 2003

(30) Foreign Application Priority Data

Dec. 7, 2001 (JP) .......................................... 2001-374364

(51) Int. Cl.[7] ................................................. G06F 17/50
(52) U.S. Cl. ...................... 716/2; 716/5; 716/7; 716/11; 716/18
(58) Field of Search .............................. 716/2, 5, 7, 11, 716/18

(56) References Cited

U.S. PATENT DOCUMENTS 6,421,816 B1 * 7/2002 Ishikura .......................... 716/7
6,493,863 B1 * 12/2002 Hamada et al. ............... 716/18

FOREIGN PATENT DOCUMENTS

| JP | 11-274311 | 10/1999 |
| JP | 2000-020576 | 1/2000 |
| JP | 2000-148833 | 5/2000 |
| JP | 2000-349161 | 12/2000 |

* cited by examiner

Primary Examiner—Thuan Do
(74) Attorney, Agent, or Firm—Arent Fox PLLC

(57) ABSTRACT

A method for designing power supply wiring of a semiconductor integrated circuit having a logic circuit. A first power consumption value of the logic circuit is calculated based on logic connection information, and the power supply wiring is laid out in accordance with the first power consumption value. Logic modification connection information relating to the modified logic circuit is generated when the logic circuit is modified after the power supply wiring is laid out. A second power consumption value of the modified logic circuit is calculated based on the logic modification connection information. When the second power consumption value exceeds the first power consumption value, it is determined that the power supply wiring must be re-laid out. It is thus easily determined whether to re-lay out the power supply wiring without performing power supply network analysis.

20 Claims, 7 Drawing Sheets

METHOD AND APPARATUS FOR LAYING OUT POWER SUPPLY WIRING

CROSS-REFERENCE TO RELATED APPLICATIONS

This application is based upon and claims the benefit of priority from the prior Japanese Patent Application No. 2001-374364, filed on Dec. 7, 2001, the entire contents of which are incorporated herein by reference.

BACKGROUND OF THE INVENTION

The present invention relates to the designing a semiconductor integrated circuit, and more particularly, to the designing of power supply wiring of a semiconductor integrated circuit.

In the prior art, the enlargement and higher speed of an LSI has increased the ratio of the area occupied by a power supply in a semiconductor integrated circuit. It is thus required that power supply wiring be optimized to guarantee the reliability of the power supply and reduce the affect on the operation of a semiconductor integrated circuit device.

Two examples of methods for designing a power supply of an LSI are described below.

(1) In the first method, a power supply wiring having sufficient power supply capacity is designed without taking into consideration the power consumption of the logic circuit. In this case, the power supply wiring is not changed even if the logic circuit is modified. After the layout of a semiconductor integrated circuit (LSI) is completed, it is normally determined whether to modify the logic circuit based on the results of various verifications, such as timing verification and crosstalk verification.

(2) In the second method, the layout of a power supply wiring is changed after the logic circuit is modified, and power supply verification is conducted on the modified layout. When it is determined from the result of the verification that the characteristic must be improved, the power supply wiring is laid out again (Japanese Laid-Open Patent Publication No. 2000-20576).

However, the first method results in redundant power supply wiring and increases the area of the semiconductor integrated circuit. Further, if the power supply wiring does not have sufficient power supply capacity, a voltage drop would lead to insufficient power supply voltage. In such a case, the same operations as those performed during a circuit simulation may not be obtained.

In the second method, when the logic circuit is modified, the layout must always be changed and the power supply verification (power supply network analysis) must always be performed. The layout modification and the power supply network analysis increase design costs. Further, when the logic circuit is modified to adjust timings or to cope with crosstalk, a cell, such as a gate, is newly added to the logic circuit. The layout of the power supply wiring is changed in accordance with the modification of the logic circuit. The layout modification varies the characteristic of the semiconductor integrated circuit. Thus, to improve the characteristic of the semiconductor integrated circuit having the new layout subsequent to the modification, timings must be adjusted again and crosstalk must be coped with again. As a result, there would be no meaning to the addition of the cell when modifying the first logic circuit. Such modification of the logic circuit, change in the layout of the power supply wiring, and the power supply verification are repeated the number of times. This increases designing costs.

SUMMARY OF THE INVENTION

One perspective of the present invention is a method for designing power supply wiring of a semiconductor integrated circuit having a logic circuit. The method includes calculating a first power consumption value of the logic circuit based on logic connection information, laying out the power supply wiring in accordance with the first power consumption value, and generating logic modification connection information when the logic circuit is modified after the power supply wiring is laid out. The logic modification connection information is related to the modified logic circuit. The method also includes calculating a second power consumption value of the modified logic circuit based on the logic modification connection information, comparing the first power consumption value and the second power consumption value, and determining whether the power supply wiring must be re-laid out based on the comparison.

A further perspective of the present invention is a method for designing power supply wiring of a semiconductor integrated circuit having a logic circuit. The logic circuit may be modified after the power supply wiring is laid out by increasing elements of the logic circuit. The method includes calculating a marginal value of power consumption that corresponds to an assumed increase in elements of the logic circuit when the logic circuit is modified based on logic connection information and margin setting information, and generating logic modification connection information when the logic circuit is modified. The logic modification connection information is related to the modified logic circuit. The method further includes calculating a power consumption difference that corresponds to an actual increase in elements of the modified logic circuit based on the logic connection information and the logic modification connection information, comparing the marginal value and the power consumption difference, and determining whether or not the power supply wiring must be re-laid out based on the comparison.

A further perspective of the present invention is a method for designing power supply wiring of a semiconductor integrated circuit having a logic circuit that includes a plurality of logic elements. The logic circuit may be modified after the power supply wiring is laid out by changing the number of the logic elements. The method includes calculating the number of first logic elements of the logic circuit based on logic connection information, generating logic modification connection information related with the modified logic circuit when the logic circuit is modified, calculating the number of second logic elements of the modified logic circuit based on the logic modification connection information, comparing the first logic element number and the second logic element number, and determining whether the power supply wiring must be re-laid out based on the comparison.

A further perspective of the present invention is a method for designing power supply wiring of a semiconductor integrated circuit having a logic circuit that includes a plurality of logic elements. The logic circuit may be modified after the power supply wiring is laid out by changing the area of the logic elements. The method includes calculating the area of a first logic element of the logic circuit based on logic connection information, generating logic modification connection information related with the modified logic circuit when the logic circuit is modified, calculating the area of a second logic element of the modified logic circuit based on the logic modification connection information, comparing the first logic element area and the second logic element area, and determining whether the power supply wiring must be re-laid out based on the comparison.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
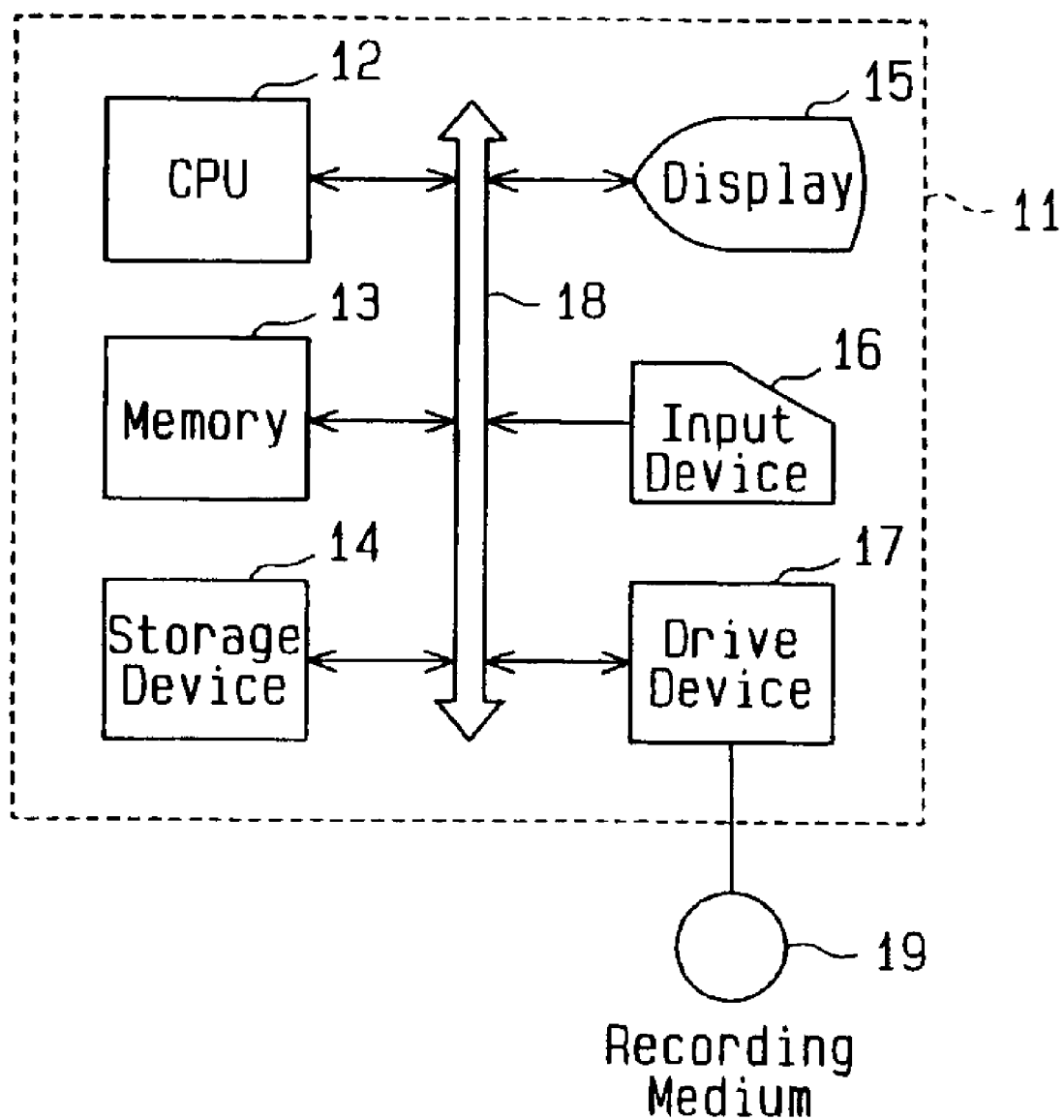
FIG. 1 is a schematic block diagram of a layout designing apparatus according to a first embodiment of the present invention.

In the drawings, like numerals are used for like elements throughout.

FIG. 1 shows a layout designing apparatus 11 according to a first embodiment of the present invention. The layout designing apparatus 11, which is a computer aided design (CAD) apparatus, includes a central processing unit (CPU) 12, a memory 13, a storage device 14, a display 15, an input device 16, and a drive device 17.

The CPU 12 uses the memory 13 to execute a program and perform the designing of power supply wiring (layout designing). The memory 13 stores the program and data required for the layout designing. The memory 13 includes a cache memory, a system memory, and a display memory.

The display device 15 displays a layout screen, a parameter input screen, and other screens. A cathode-ray tube (CRT), a liquid-crystal display (LCD), or a plasma display panel (PDP) may be used as the display device 15. A user uses the input device 16 to input requests, commands, and parameters. A keyboard and a mouse are used as the input device 16.

A magnetic disk device, an optical disc device, or a magneto-optic disc may be used as the storage device 14. Program data and various types of data files are stored in the storage device 14 to perform the layout designing process.

In response to a command from the input device 16, the CPU 12 transfers a program and data files to the memory 13 to execute the program. The storage device 14 is also used as a database.

The files stored in the storage device 14 are each associated with data. However, multiple pieces of data may be stored in a single file. Alternatively, each piece of data may be divided, and the divided data may be stored in multiple files. Further, data files that are temporarily generated may be stored in the memory 13.

The drive device 17 accesses a recording medium 19 and reads an execution program of the CPU 12 from the recording medium 19. The CPU 12 installs the program read from the drive device 17 in the storage device 14.

A computer-readable recording medium, such as a memory card, a flexible disk, an optical disc (e.g., CD-ROM, DVD-ROM), or a magneto-optic disc (e.g., MO, MD), may be used as the recording medium 19. When necessary, the program recorded on the recording medium 19 is loaded to the memory 13.

The recording medium 19 may be a medium or a disc device recording a program that is uploaded or downloaded via a communication medium. In addition to a recording medium recording a program directly executed by a computer, the recording medium 19 may be a recording medium recording a program that becomes executable after being installed in another recording medium (e.g., hard disk) or a recording medium recording an encoded or compressed program.

Figure 2:
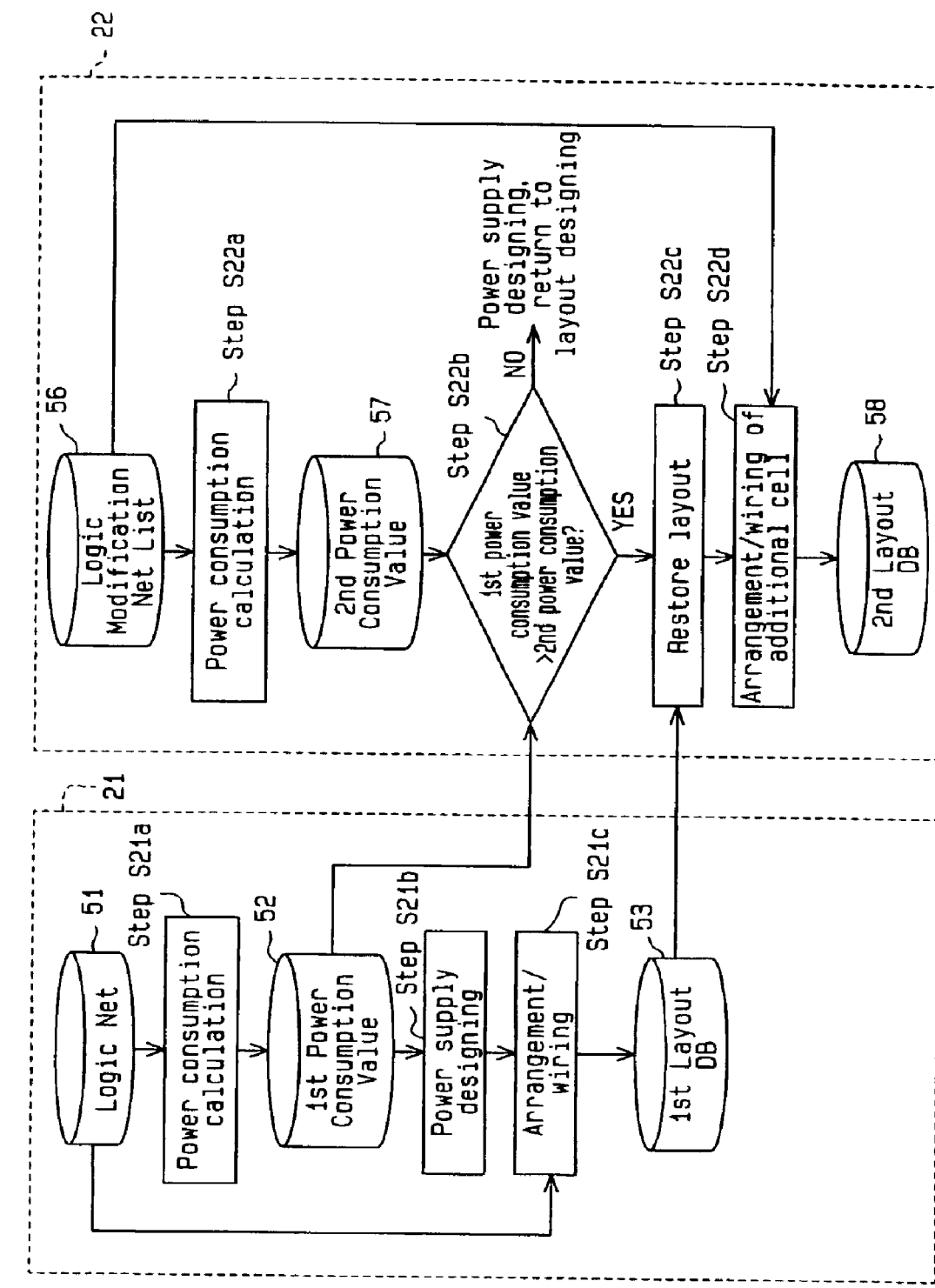
FIG. 2 is a schematic diagram illustrating a process for laying out a semiconductor integrated circuit in the first embodiment of the present invention.

FIG. 2 is a schematic diagram illustrating a power supply wiring designing (layout designing) process performed by the layout designing apparatus 11 of FIG. 1.

The layout designing process includes a first designing process 21 and a second designing process 22, which are performed by the CPU 12 of the layout designing apparatus 11.

The first designing process 21 includes a power supply wiring designing process to generate a layout database (DB), which includes power supply wiring, with a logic net list, which is logic connection information. The logic net list is, for example, design data of a semiconductor integrated circuit (IC) designed by, for example, a CAD apparatus (not shown). The design data includes connection information (logic connection information) of devices in a logic circuit. The logic circuit corresponds to a functional macro. In the first embodiment, the semiconductor integrated circuit has a single functional macro. However, the present invention may also be applied to a semiconductor integrated circuit having multiple functional macros.

The first designing process 21 includes the following steps S21a–S21c. The CPU 12 first calculates a first power consumption value using a logic net list, which is stored in a file 51, and stores the first power consumption value in a file 52 (step S21a). A method described in, for example, Japanese Laid-Open Patent Publication No. 2000-148833 may be used to calculate the first power consumption value. The method will not be described here.

The CPU 12 then performs power supply designing that is in accordance with the power consumption capacity based on the first power consumption value, which is stored in the file 52, to generate power supply wiring (step S21b). In the power supply designing of step S21b, for example, a power supply network optimization process is performed. A method described in, for example, Japanese Laid-Open Patent Publication No. 2000-349161 may be used to perform the power supply designing of step S21b.

Then, based on the power supply wiring, the CPU 12 uses the logic network list to design the specific arrangement of cells and inter-cell wiring (hereinafter referred to as arrangement and wiring of cells) and generate layout data (hereinafter referred to as first layout DB) (step S21c). The first layout DB is stored in the file 53. The CPU 12 performs power supply verification based on the first layout DB.

In the power supply verification, various verifications, such as timing verification and crosstalk verification, are performed based on the first layout DB and logic modifications are made in accordance with the verification results. When a logic modification is made, the CPU 12 performs the second designing process 22. In other words, when a logical modification is not made, the second designing process 22 is not performed.

The second designing process 22 includes a power supply designing process that is in accordance with the logic modification. The second designing process 22 includes the following steps S22a to S22d. When a logic modification is made, the CPU 12 generates a logic modification net list (logic modification connection information) that is in accordance with the modified logic circuit. Then, the CPU 12 stores the logic modification net list in a file 56. The CPU 12 uses the logic modification net list stored in the file 56 to calculate a second power consumption value and stores the second power consumption value in a file 57 (step S22a).

Subsequently, the CPU 12 compares the first and second power consumption values to perform a power consumption determination (step S22b). More specifically, the CPU 12 determines whether the second power consumption value, which is obtained subsequent to the logic modification, is greater than the first power consumption value, which is obtained prior to the logic modification. When the second power consumption value is greater than the first power consumption value, the power supply must be re-designed. Accordingly, the CPU 12 performs the power supply designing (step S21b) of the first designing process 21 in accordance with the second consumption value. When the second power consumption value is not greater than the first power consumption value, the CPU 12 restores the layout DB (logic net list) prior to the logic modification from the first layout DB. That is, the CPU 12 restores (copies) the power supply wiring information, the cell arrangement information, and the wiring (connection) information from the first layout DB. The CPU 12 uses the layout DB prior to the logic modification to perform layout designing of additional cell arrangements and wiring (step S22d) and stores the layout data (hereinafter referred to as second layout DB) in a file 58.

The layout designing process of FIG. 2 will now be described in detail with reference to FIGS. 3 and 4.

Figure 3:
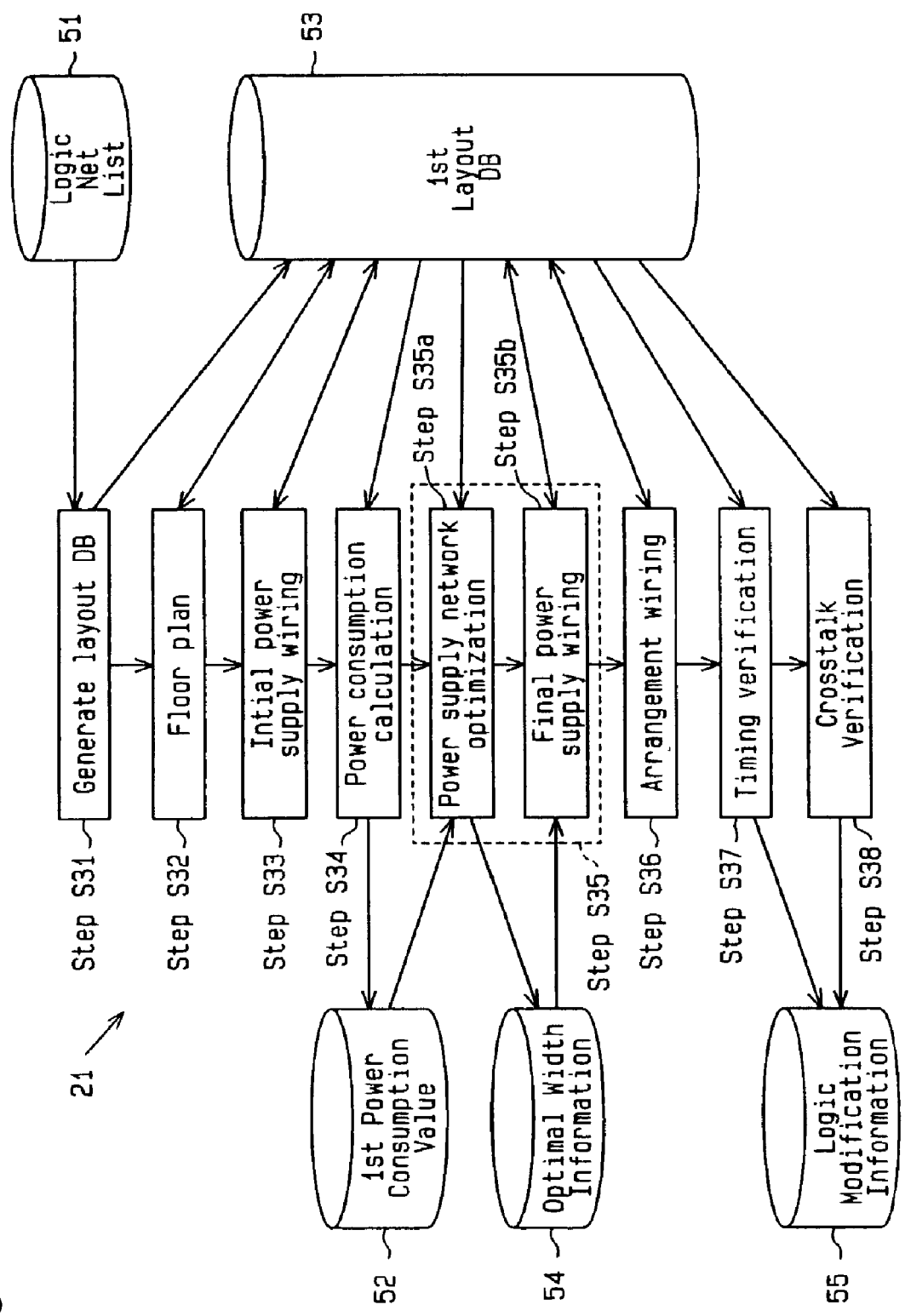
FIG. 3 is a flowchart illustrating the semiconductor integrated circuit layout process of FIG. 2.

FIG. 3 is a flowchart illustrating the first designing process 21 of FIG. 2 in detail. FIG. 4 is a flowchart illustrating the second designing process 22 of FIG. 4 in detail.

The CPU 12 extracts designing data from the logic net list stored in the file 51 and generates a first layout DB, which is used for power supply designing, from the designing data (step S31). The first layout DB is stored in the file 53.

Then, the CPU 12 makes a floor plan, which is used for the layout designing (step S32). More specifically, the CPU 12 sets the arrangement region of a hard macro and logic hierarchies and arrangement prohibition regions. The CPU 12 stores the floor plan setting information in the file 53 and updates the first layout DB.

The CPU 12 generates initial power supply wiring based on the floor plan setting information while taking into consideration the hard macro arrangement position (step S33) and updates the first layout DB stored in the file 53. The CPU 12 calculates the first power consumption value using the information of the first layout DB (step S34) and stores the first power consumption value in the file 52.

Then, the CPU 12 uses the first power consumption value to perform power supply designing that is in accordance with the power consumption capacity and generates the power supply wiring (step S35). More specifically, the CPU 12 performs a power supply width optimization process on the initial power supply wiring based on the first power consumption value (step S35a) and generates optimal width information. The optimal width information is stored in the file 54. In the power supply width optimization process, the CPU 12, for example, calculates the current capacity ratio of each power supply wiring in the initial power supply wiring based on the first power consumption value to change the width of each power supply wiring so that each current capacity ratio is included within a predetermined range and generates the optimal width information. The CPU 12 generates the final power supply wiring based on the optimal width information and updates the first layout DB stored in the file 53 (step S35b).

The CPU 12 performs the arrangement and wiring of cells based on the final power supply wiring stored in the first layout DB and updates the first layout DB stored in the file 53 (step S36). Then, the CPU 12 performs verifications, such as timing verification (step S37) and crosstalk verification (step S38), based on the first layout DB. The CPU 12 generates logic modification information that is in accordance with the verification results. The logic modification information is stored in the file 55. When the verification results indicate that logic modification is not necessary, the logic modification information is not generated.

Figure 4:
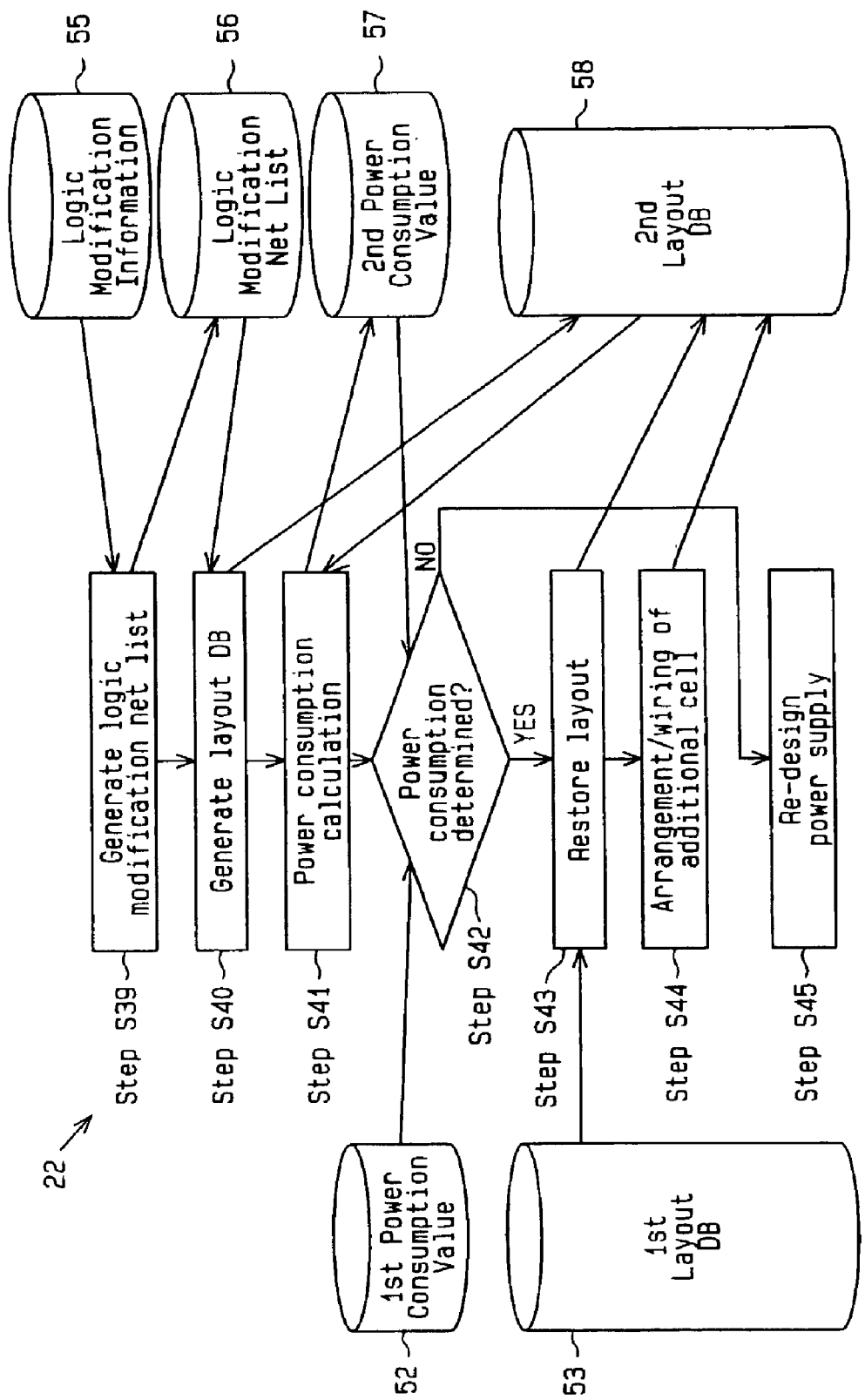
FIG. 4 is a flowchart illustrating the semiconductor integrated circuit layout process of FIG. 2.

Referring to FIG. 4, when logic modification is necessary, the CPU 12 uses the logic modification information stored in the file 55 to generate a logic modification net list corresponding to the logic circuit subsequent to the modification and stores the logic modification net list into the file 56 (step S39). The CPU 12 generates the second layout DB including the logic modification net list and stores the second layout DB in the file 58 (step S40).

The CPU 12 calculates the second power consumption value using the information of the logic modification net list in the second layout DB and stores the second power consumption value in the file 57 (step S41).

The CPU 12 then compares the first power consumption value prior to the logic modification with the second power consumption value subsequent to the modification to perform power consumption determination (step S42). When the first power consumption value is less than the second power consumption value, the CPU 12 performs step S35 (power supply designing) and the processing subsequent to step S35 again (step S45). When the first power consumption value is greater than the second power consumption value, the CPU 12 restores the layout DB prior to the logic modification from the first layout DB (step S43) and stores the restored layout DB in the file 58. The CPU 12 performs layout designing of arrangement of addition cells and the wirings subsequent to the logic modification and updates the second layout DB stored in the file 58 (step S44).

The layout designing apparatus 11 of the first embodiment has the following advantages.

(1) The CPU 12 calculates the first power consumption value based on the logic net list and performs power supply designing using the first power consumption value. Then, when the results of the timing verification and other verifications indicate that logic modification is necessary, the CPU 12 calculates the second power consumption value based on the logic modification net list. The CPU 12 compares the first power consumption value with the second power consumption value, and determines whether re-designing of the power supply subsequent to the logic modification is necessary based on the comparison result. Accordingly, when logic modification is performed, it is easily determined whether re-designing of the power supply is necessary by comparing the values obtained from the power consumption calculation without performing power supply network analysis. This reduces the turnaround time (TAT) for wiring designing and shortens the designing time.

(2) When logic modification is performed due to timing adjustment or to cope with crosstalk, the layout of the wiring is changed virtually without changing the arrangement of cells. When logic modification is performed in this manner, the power consumption does not fluctuate significantly. Thus, it is determined with high accuracy whether re-designing is necessary by comparing the first power consumption value prior to the logic modification with the second power consumption value subsequent to the logic modification.

(3) When the re-designing of the power supply is not necessary, the re-laying out of the power supply wiring and the power supply network analysis are not necessary. Accordingly, an increase in the designing costs that would result from the re-laying out and the power supply network analysis is prevented.

Figure 5:
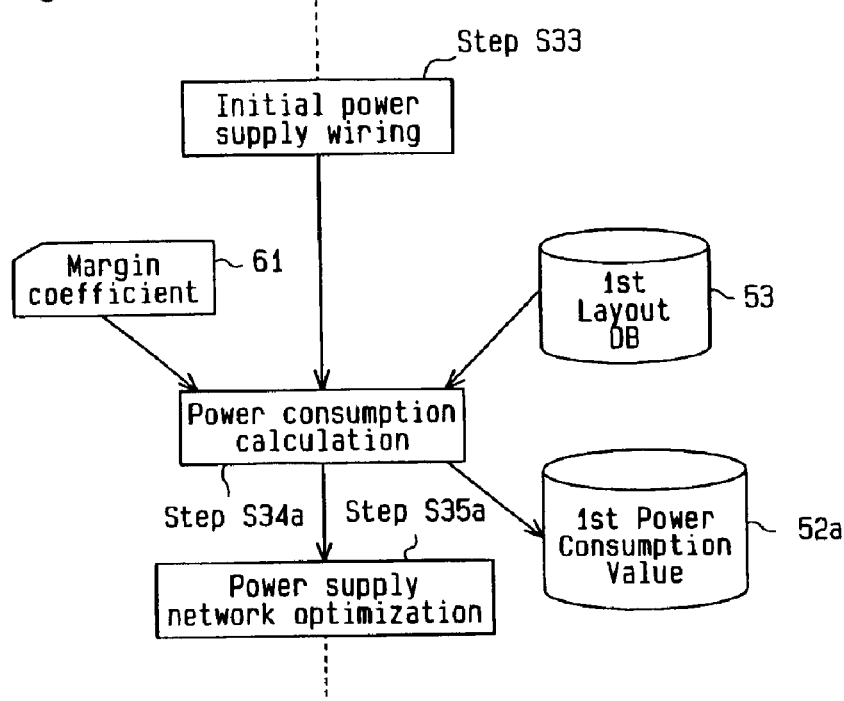
FIG. 5 is a schematic diagram illustrating a process for laying out a semiconductor integrated circuit in a second embodiment of the present invention.

FIG. 5 is a flowchart for illustrating a layout designing process of a semiconductor integrated circuit according to a second embodiment of the present invention. In the layout designing process of the second embodiment, step S34 (calculation of the first power consumption value) of the layout designing process of the first embodiment is replaced by step S34a. In step 34a, the first power consumption value is calculated to include the increased amount of power consumption subsequent to the logic modification.

More specifically, the first power consumption value is calculated based on a margin coefficient stored in a file 61. The CPU 12 receives the margin coefficient from the file 61, calculates the first power consumption value from the margin coefficient and the first layout DB stored in the file 53, and stores the first power consumption value in a file 52a (step S34a).

The margin coefficient is an assumed value obtained through statistic analysis that takes into consideration the increased power consumption amount of the logic circuit resulting from logic modification. For example, when the designing rule is a semiconductor integrated circuit having 0.18 $\mu$m, it is preferred that the margin coefficient be 15%. To obtain the margin coefficient through statistic analysis, elements, such as clock synthesizing, fan-out adjustment, timing adjustment subsequent to the laying out, and buffers added to cope with crosstalk noise, are used.

In the layout designing process of the second embodiment, the CPU 12 calculates the first power consumption value based on the margin coefficient stored in the file 61. The first power consumption value calculated in this manner includes the increased power consumption subsequent to the logic modification. Accordingly, in the initial stage, the power supply wiring is generated taking into consideration the logic modification. This decreases the possibility of redesigning of the power supply due to logic modification since the power supply wiring is generated taking into consideration the logic modification. In other words, the frequency of power supply redesigning when logic modification is performed decreases.

Figure 6:
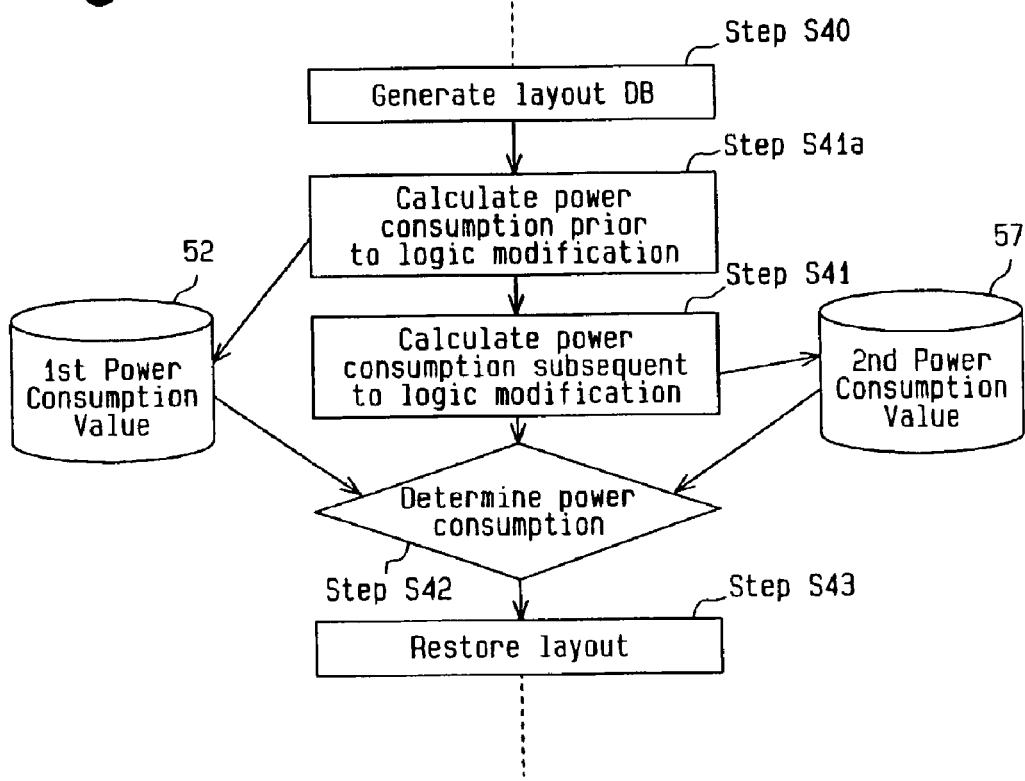
FIG. 6 is a schematic diagram illustrating a process for laying out a semiconductor integrated circuit in a third embodiment of the present invention.

FIG. 6 is a flowchart illustrating a layout process of a semiconductor integrated circuit according to a third embodiment of the present invention. In the layout process of the third embodiment, step S41a, in which the first power consumption value prior to the logic modification is calculated again, is performed before step S41 (calculation of the second power consumption value) of the first embodiment. In other words, in step S41a, the CPU 12 re-calculates the first power consumption value prior to the logic modification and stores the first power consumption value in the file 52. The first power consumption value is stored in the file 52 whenever the logic modification occurs.

Figure 7:
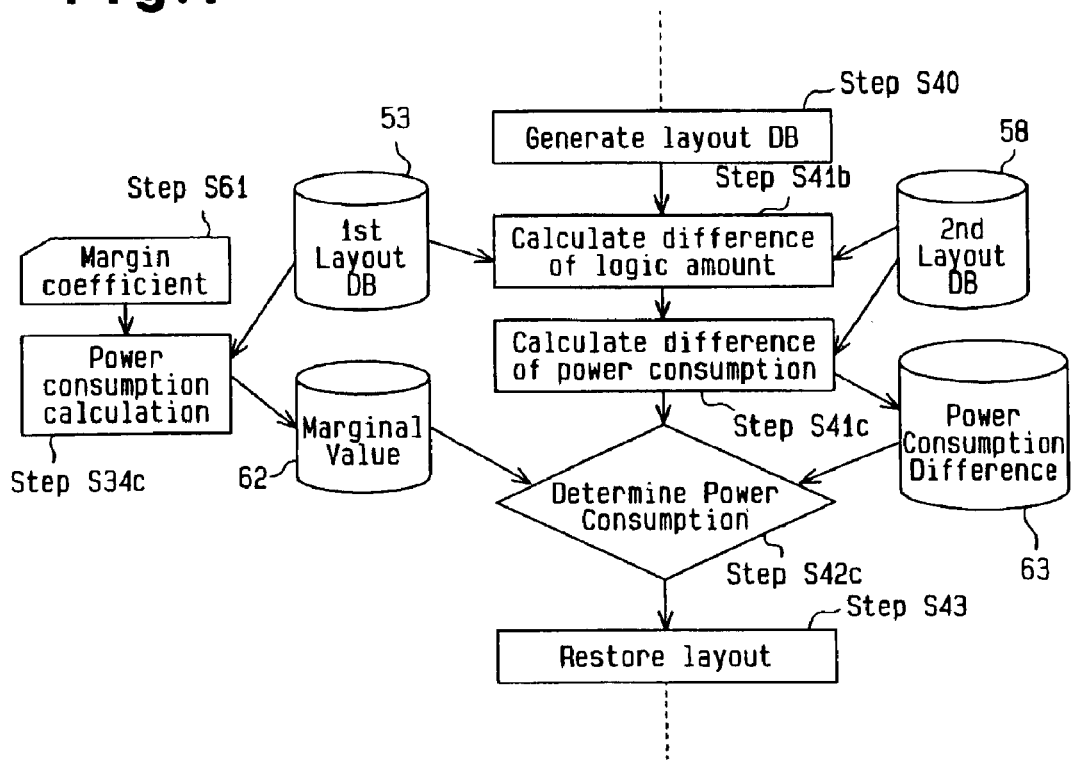
FIG. 7 is a schematic diagram illustrating a process for laying out a semiconductor integrated circuit in a fourth embodiment of the present invention.

FIG. 7 is a flowchart illustrating a layout process of a semiconductor integrated circuit according to a fourth embodiment of the present invention. In the fourth embodiment, the necessity of re-designing the power supply is determined from the difference between the power consumption value prior to the logic modification and the power consumption value subsequent to the logic modification.

The CPU 12 calculates a marginal value of power consumption in the initial stage of power supply designing (first designing process 21) based on the margin coefficient stored in the file 61 and the first layout DB stored in the file 53. The CPU 12 then stores the marginal value in the file 62 (step S34c). The marginal value is an assumed value of the power consumption value corresponding to the increase in the logic circuit subsequent to the logic modification and is calculated in accordance with the margin coefficient. In step S34c, the CPU 12 calculates the first power consumption value required to generate the final power supply wiring of the first layout DB in the same manner as in the first embodiment.

When logic modification is performed, the CPU 12 calculates the difference between the number of logic cells prior to the logic modification and the number of logic cells subsequent to the logic modification (difference of logic amount) based on the first layout DB and the second layout DB, which is generated by the logic modification (step S41b). The CPU 12 calculates the power consumption related to the difference of the logic amount (step S41c) and stores the calculated power consumption difference in the file 63.

The CPU 12 compares the marginal value and the power consumption difference to determine the power consumption (step S42c) and determines whether or not re-designing of the power supply is necessary. In this manner, in the fourth embodiment, the difference between the power consumption prior to the logic modification and the power consumption subsequent to the logic modification is used to facilitate the determination of whether or not to re-design the power supply.

Figure 8:
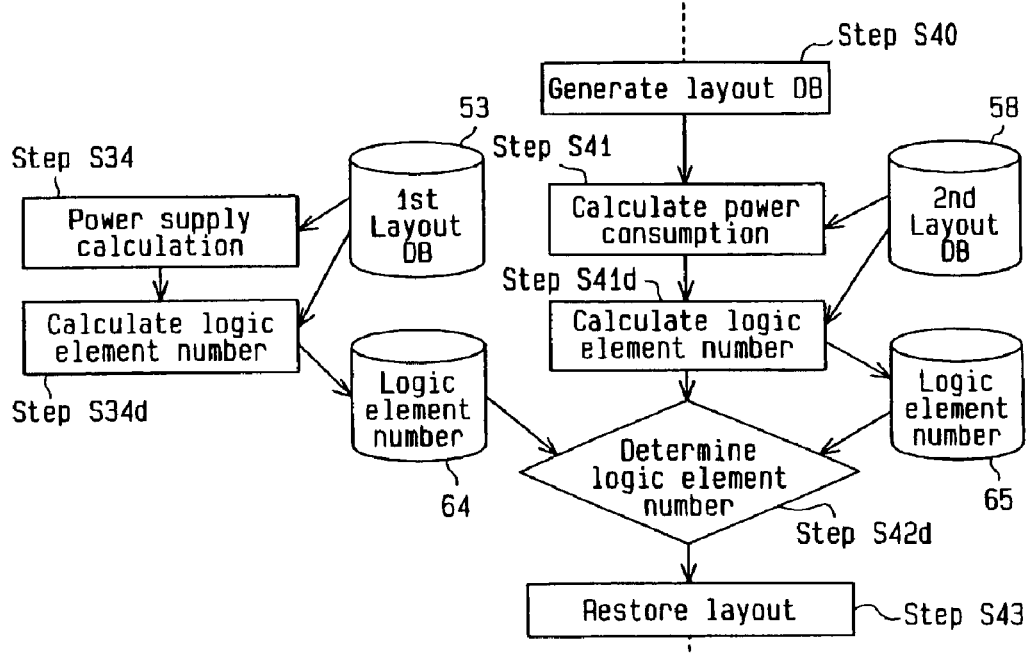
FIG. 8 is a schematic diagram illustrating a process for laying out a semiconductor integrated circuit in a fifth embodiment of the present invention.

FIG. 8 is a flowchart illustrating a layout process according to a fifth embodiment of the present invention. In the fifth embodiment, the determination of whether or not power supply re-designing is necessary is performed based on comparison between the number of logic elements used prior to the logic modification and the number of logic elements used subsequent to the logic modification. The logic elements are circuit elements for achieving logic functions, such as a functional cell or a macro cell of a logic circuit.

After step S34 (the calculation of the first power consumption value prior to the logic modification), the CPU 12 extracts the number of first logic elements used in the logic circuit from the first layout DB stored in the file 53 and stores the first logic element number in a file 64 (step S34d).

When logic modification is performed, the CPU 12 calculates the second power consumption value based on the second layout DB, which is generated by the logic modification. Then, the CPU 12 extracts the number of second logic elements used in the logic circuit subsequent to the modification from the second layout DB and stores the second logic element number in a file 65 (step S41d).

The CPU 12 compares the first and second logic element numbers stored in the files 64, 65, respectively, and determines whether or not the re-designing of the power supply is necessary (step S42d). Such determination of whether or not the re-designing of the power supply is necessary based on the used logic element numbers is especially effective when the first and second power consumption values are assumed to be about the same.

Figure 9:
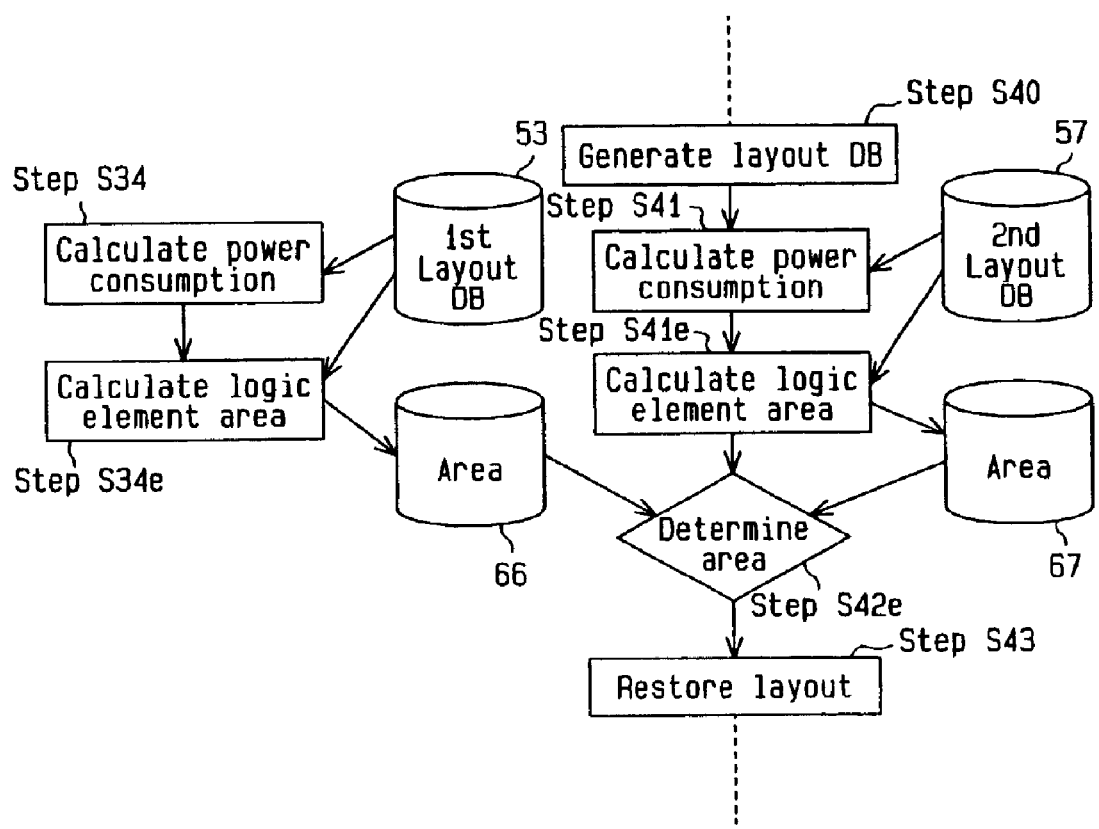
FIG. 9 is a schematic diagram illustrating a process for laying out a semiconductor integrated circuit in a sixth embodiment of the present invention.

FIG. 9 is a flowchart illustrating a layout process of a semiconductor integrated circuit according to a sixth embodiment of the present invention. In the sixth embodiment, the determination of whether or not to re-design the power supply is performed based on the comparison between the area of the logic element prior to logic modification and the area of the used logic elements subsequent to the logic modification.

After calculating the first power consumption value subsequent to the logic modification in step S34, the CPU 12 calculates a first area value of the logic elements used in the logic circuit from the first layout DB and stores the first area value in a file 66 (step S34e).

When a logic modification is performed, in step S41, the CPU 12 calculates the second power consumption value subsequent to the logic modification. Then, the CPU 12 calculates a second area value of the logic elements used in the logic circuit subsequent to the logic modification from the second layout DB and stores the second area value in file 67 (step S41e).

The CPU 12 compares the first and second area values stored in the files 66, 67, respectively, and determines whether or not the re-designing of the power supply is necessary (step S42e). In this manner, the re-designing of the power supply is easily performed using the area value of the used logic elements.

It should be apparent to those skilled in the art that the present invention may be embodied in many other specific forms without departing from the spirit or scope of the invention. Particularly, it should be understood that the present invention may be embodied in the following forms.

The present invention may be applied when logic modification is performed based on results of verifications other than the timing verification and the crosstalk verification that are conducted on layouts in the initial state of power supply designing (first designing process 21).

Although an example of restoring the layout result of the first layout DB in the second layout DB subsequent to the logic modification is described above, such layout result does not necessarily have to be used. That is, when the logic modification virtually does not require changes in the arrangement of cells such as when coping with crosstalk noise or when adjusting timings, the already available layout results may be used.

In the layout designing process of FIG. 3, the power consumption calculation of step S34 may be performed before the initial power supply wiring of step S33.

In the second embodiment, instead of storing the margin coefficient in the file 61 (i.e., defining in a library), the margin coefficient may be set by a control card based on a user designation.

In the second embodiment, the value of the margin coefficient in the second embodiment may be set at a value other than 15% and may be changed in accordance with a designing rule.

In the fourth embodiment, when there is no margin coefficient, the determination of whether or not the redesigning of the power supply is necessary may be performed based on the polarity (positive or negative) of the power consumption value difference instead of the difference between the marginal value and the power consumption value difference.

In the fifth and sixth embodiment, the power consumption calculation based on the first layout DB (step S34) or the power consumption calculation based on the second layout DB (step S41) may be eliminated. In this case, power consumption calculation is performed only when redesigning of the power supply based on the logic element number determination result is necessary. Further, in the sixth embodiment, the power consumption calculation of steps S34 and S41 may be performed only when the re-designing of the power supply based on the area value determination result is necessary.

In the fifth embodiment, the logic element number determination is performed by extracting the first and second logic element numbers from the first layout DB and the second layout DB. However, the difference between the first logic element number and the second logic element number may be extracted based on the first and second layout DBs, and the determination may be performed using the difference of the logic element numbers.

In the sixth embodiment, the difference between the first logic area and the second logic area may be extracted from the first and second layout DBs, and the determination may be performed using the difference of the areas.

It should be apparent to those skilled in the art that the present invention may be embodied in many other specific forms without departing from the spirit or scope of the invention. Particularly, it should be understood that the present invention may be embodied in the following forms.

What is claimed is:

1. A method for designing power supply wiring of a semiconductor integrated circuit having a logic circuit, the method comprising:

calculating a first power consumption value of the logic circuit based on logic connection information;

laying out the power supply wiring in accordance with the first power consumption value;

generating logic modification connection information when the logic circuit is modified after the power supply wiring is laid out, wherein the logic modification connection information is related to the modified logic circuit;

calculating a second power consumption value of the modified logic circuit based on the logic modification connection information;

comparing the first power consumption value and the second power consumption value; and determining whether the power supply wiring must be re-laid out based on the comparison.

2. The method according to claim 1, further comprising:

storing the first power consumption value; and storing the second power consumption value.

3. The method according to claim 1, further comprising:
re-laying out the power supply wiring in accordance with the second power consumption value when the second power consumption value exceeds the first power consumption value.

4. The method according to claim 1, further comprising:
restoring the layout of the power supply wiring when the second power consumption value is less than the first power consumption value.

5. The method according to claim 1, wherein the first power consumption value includes a marginal value of power consumption that corresponds to an assumed increase in elements of the logic circuit when the logic circuit is modified.

6. A method for designing power supply wiring of a semiconductor integrated circuit having a logic circuit, wherein the logic circuit may be modified after the power supply wiring is laid out by increasing elements of the logic circuit, the method comprising:
calculating a marginal value of power consumption that corresponds to an assumed increase in elements of the logic circuit when the logic circuit is modified based on logic connection information and margin setting information;
generating logic modification connection information when the logic circuit is modified, wherein the logic modification connection information is related to the modified logic circuit;
calculating a power consumption difference that corresponds to an actual increase in elements of the modified logic circuit based on the logic connection information and the logic modification connection information;
comparing the marginal value and the power consumption difference; and
determining whether or not the power supply wiring must be re-laid out based on the comparison.

7. A method for designing power supply wiring of a semiconductor integrated circuit having a logic circuit that includes a plurality of logic elements, wherein the logic circuit may be modified after the power supply wiring is laid out by changing the number of the logic elements, the method comprising:
calculating the number of first logic elements of the logic circuit based on logic connection information;
generating logic modification connection information related with the modified logic circuit when the logic circuit is modified;
calculating the number of second logic elements of the modified logic circuit based on the logic modification connection information;
comparing the first logic element number and the second logic element number; and
determining whether the power supply wiring must be re-laid out based on the comparison.

8. A method for designing power supply wiring of a semiconductor integrated circuit having a logic circuit that includes a plurality of logic elements, wherein the logic circuit may be modified after the power supply wiring is laid out by changing the spatial area of the logic elements, the method comprising:
calculating the spatial area of a first logic element of the logic circuit based on logic connection information;
generating logic modification connection information related with the modified logic circuit when the logic circuit is modified;
calculating the spatial area of a second logic element of the modified logic circuit based on the logic modification connection information;
comparing the spatial area of the first logic element and the spatial area of the second logic element; and
determining whether the power supply wiring must be re-laid out based on the comparison.

9. An apparatus for designing power supply wiring of a semiconductor integrated circuit having a logic circuit, the apparatus comprising:
a processor unit for;
calculating a first power consumption value of the logic circuit based on logic connection information;
laying out the power supply wiring in accordance with the first power consumption value;
generating logic modification connection information when the logic circuit is modified after the power supply wiring is laid out, wherein the logic modification connection information is related to the modified logic circuit;
calculating a second power consumption value of the modified logic circuit based on the logic modification connection information;
comparing the first power consumption value and the second power consumption value; and
determining whether the power supply wiring must be re-laid out based on the comparison.

10. An apparatus for designing power supply wiring of a semiconductor integrated circuit having a logic circuit, wherein the logic circuit may be modified after the power supply wiring is laid out by increasing elements of the logic circuit, the apparatus comprising:
a processor unit for;
calculating a marginal value of power consumption that corresponds to an assumed increase in elements of the logic circuit when the logic circuit is modified based on logic connection information and margin setting information;
generating logic modification connection information when the logic circuit is modified, wherein the logic modification connection information is related to the modified logic circuit;
calculating a power consumption difference that corresponds to an actual increase in elements of the modified logic circuit based on the logic connection information and the logic modification connection information;
comparing the marginal value and the power consumption difference; and
determining whether or not the power supply wiring must be re-laid out based on the comparison.

11. An apparatus for designing power supply wiring of a semiconductor integrated circuit having a logic circuit that includes a plurality of logic elements, wherein the logic circuit may be modified after the power supply wiring is laid out by changing the number of the logic elements, the apparatus comprising:
a processor unit for;
calculating the number of first logic elements of the logic circuit based on logic connection information;
generating logic modification connection information related with the modified logic circuit when the logic circuit is modified;
calculating the number of second logic elements of the modified logic circuit based on the logic modification connection information;

comparing the first logic element number and the second logic element number; and determining whether the power supply wiring must be re-laid out based on the comparison.

12. An apparatus for designing power supply wiring of a semiconductor integrated circuit having a logic circuit that includes a plurality of logic elements, wherein the logic circuit may be modified after the power supply wiring is laid out by changing the area of the logic elements, the apparatus comprising:

a processor unit for;

calculating the area of a first logic element of the logic circuit based on logic connection information;

generating logic modification connection information related with the modified logic circuit when the logic circuit is modified;

calculating the area of a second logic element of the modified logic circuit based on the logic modification connection information;

comparing the first logic element area and the second logic element area; and determining whether the power supply wiring must be re-laid out based on the comparison.

13. A recording medium recorded thereon a computer-readable program for designing power supply wiring of a semiconductor integrated circuit having a logic circuit, the program causing a computer to perform a method comprising:

calculating a first power consumption value of the logic circuit based on logic connection information;

laying out the power supply wiring in accordance with the first power consumption value;

generating logic modification connection information when the logic circuit is modified after the power supply wiring is laid out, wherein the logic modification connection information is related to the modified logic circuit;

calculating a second power consumption value of the modified logic circuit based on the logic modification connection information;

comparing the first power consumption value and the second power consumption value; and determining whether the power supply wiring must be re-laid out based on the comparison.

14. A recording medium recorded thereon a computer-readable program for designing power supply wiring of a semiconductor integrated circuit having a logic circuit, wherein the logic circuit may be modified after the power supply wiring is laid out by increasing elements of the logic circuit, the program causing a computer to perform a method comprising:

calculating a marginal value of power consumption that corresponds to an assumed increase in elements of the logic circuit when the logic circuit is modified based on logic connection information and margin setting information;

generating logic modification connection information when the logic circuit is modified, wherein the logic modification connection information is related to the modified logic circuit;

calculating a power consumption difference that corresponds to an actual increase in elements of the modified logic circuit based on the logic connection information and the logic modification connection information;

comparing the marginal value and the power consumption difference; and determining whether or not the power supply wiring must be re-laid out based on the comparison.

15. A recording medium recorded thereon a computer-readable program for designing power supply wiring of a semiconductor integrated circuit having a logic circuit that includes a plurality of logic elements, wherein the logic circuit may be modified after the power supply wiring is laid out by changing the number of the logic elements, the program causing a computer to perform a method comprising:

calculating the number of first logic elements of the logic circuit based on logic connection information;

generating logic modification connection information related with the modified logic circuit when the logic circuit is modified;

calculating the number of second logic elements of the modified logic circuit based on the logic modification connection information;

comparing the first logic element number and the second logic element number; and determining whether the power supply wiring must be re-laid out based on the comparison.

16. A recording medium recorded thereon a computer-readable program for designing power supply wiring of a semiconductor integrated circuit having a logic circuit that includes a plurality of logic elements, wherein the logic circuit may be modified after the power supply wiring is laid out by changing the area of the logic elements, the program causing a computer to perform a method comprising:

calculating the area of a first logic element of the logic circuit based on logic connection information;

generating logic modification connection information related with the modified logic circuit when the logic circuit is modified;

calculating the area of a second logic element of the modified logic circuit based on the logic modification connection information;

comparing the first logic element area and the second logic element area; and determining whether the power supply wiring must be re-laid out based on the comparison.

17. A computer-readable program for designing power supply wiring of a semiconductor integrated circuit having a logic circuit, the program causing a computer to perform a method comprising:

calculating a first power consumption value of the logic circuit based on logic connection information;

laying out the power supply wiring in accordance with the first power consumption value;

generating logic modification connection information when the logic circuit is modified after the power supply wiring is laid out, wherein the logic modification connection information is related to the modified logic circuit;

calculating a second power consumption value of the modified logic circuit based on the logic modification connection information;

comparing the first power consumption value and the second power consumption value; and determining whether the power supply wiring must be re-laid out based on the comparison.

18. A recording medium recording a computer-readable program for designing power supply wiring of a semiconductor integrated circuit having a logic circuit, wherein the logic circuit may be modified after the power supply wiring is laid out by increasing elements of the logic circuit, the program causing a computer to perform a method comprising: calculating a marginal value of power consumption that corresponds to an assumed increase in elements of the logic circuit when the logic circuit is modified based on logic connection information and margin setting information;

generating logic modification connection information when the logic circuit is modified, wherein the logic modification connection information is related to the modified logic circuit;

calculating a power consumption difference that corresponds to an actual increase in elements of the modified logic circuit based on the logic connection information and the logic modification connection information;

comparing the marginal value and the power consumption difference; and determining whether or not the power supply wiring must be re-laid out based on the comparison.

19. A computer-readable program for designing power supply wiring of a semiconductor integrated circuit having a logic circuit that includes a plurality of logic elements, wherein the logic circuit may be modified after the power supply wiring is laid out by changing the number of the logic elements, the program causing a computer to perform a method comprising:

calculating the number of first logic elements of the logic circuit based on logic connection information;

generating logic modification connection information related with the modified logic circuit when the logic circuit is modified;

calculating the number of second logic elements of the modified logic circuit based on the logic modification connection information;

comparing the first logic element number and the second logic element number; and determining whether the power supply wiring must be re-laid out based on the comparison.

20. A computer-readable program for designing power supply wiring of a semiconductor integrated circuit having a logic circuit that includes a plurality of logic elements, wherein the logic circuit may be modified after the power supply wiring is laid out by changing the area of the logic elements, the program causing a computer to perform a method comprising:

calculating the area of a first logic element of the logic circuit based on logic connection information;

generating logic modification connection information related with the modified logic circuit when the logic circuit is modified;

calculating the area of a second logic element of the modified logic circuit based on the logic modification connection information;

comparing the first logic element area and the second logic element area; and determining whether the power supply wiring must be re-laid out based on the comparison.

* * * * *